United States Patent [19]

Stickel

[11] Patent Number: 4,763,021

[45] Date of Patent: Aug. 9, 1988

[54] CMOS INPUT BUFFER RECEIVER CIRCUIT WITH ULTRA STABLE SWITCHPOINT

[75] Inventor: Tedd K. Stickel, Chalfont, Pa.

[73] Assignee: Unisys Corporation, Blue Bell, Pa.

[21] Appl. No.: 69,736

[22] Filed: Jul. 6, 1987

[51] Int. Cl.[4] .......................................... H03K 17/094
[52] U.S. Cl. ..................................... 307/475; 307/443;
  307/451; 307/297; 307/310
[58] Field of Search ............... 307/443, 448, 451, 475,
  307/584–585, 264, 297, 310

[56] References Cited

U.S. PATENT DOCUMENTS

| | | | |
|---|---|---|---|
| 4,264,874 | 4/1981 | Young | 307/451 X |
| 4,380,710 | 4/1983 | Cohen et al. | 307/451 X |
| 4,430,582 | 2/1984 | Bose et al. | 307/475 X |
| 4,471,242 | 9/1984 | Noufer et al. | 307/451 X |
| 4,563,595 | 1/1986 | Bose | 307/475 X |
| 4,584,492 | 4/1986 | Sharp | 307/475 |
| 4,642,488 | 2/1987 | Parker | 307/451 X |

*Primary Examiner*—Stanley D. Miller
*Assistant Examiner*—D. R. Hudspeth
*Attorney, Agent, or Firm*—John B. Sowell; L. J. Marhoefer; T. J. Scott

[57] ABSTRACT

A CMOS buffer receiver is provided for converting TTL or CMOS input voltage signals to CMOS signals so as to drive CMOS loads on VSLI chips. The buffer receiver comprises a reference voltage generator coupled to a compensation network having an output signal which varies with process, temperature and voltage supply. The compensated output signal is coupled to the gates of any number of current source load transistors of a plurality of series connected transistor pairs which comprise individual stabilized input converters all of which have their switchpoint located in the middle of their characteristic curves so that their switchpoints are immune to process, temperature and supply voltage variations.

18 Claims, 6 Drawing Sheets

CMOS INPUT BUFFER RECEIVER CIRCUIT WITH ULTRA STABLE SWITCHPOINT

BACKGROUND OF THE INVENTION

1. Field of the Invention

The present invention relates to input buffer circuits for CMOS devices. More particularly, the present invention relates to TTL to CMOS or CMOS to CMOS input buffer receivers having extremely stable switchpoints which are insensitive to process and temperature variations.

2. Description of the Prior Art

Input buffers for TTL to CMOS signals are classified in International Class HO3K 19/094 and U.S. Class 307, Sub-Classes 475, 296, and 297.

One of the problems with normal or conventional CMOS input buffer receivers is that their switchpoints are centered about a point which is one-half the supply of voltage (approximately 2.5 volts, $V_{DD}/2$). However, the input signal to the CMOS device often does not swing around $V_{DD}/2$ but swings about or around 1.4 volts as in the case of TTL inputs. When the driver input is TTL, the switchpoint of the input CMOS buffer receiver needs to be lowered so that it is centered around 1.4 volts.

It would seem that recognition of this problem would result in being able to provide a CHOS receiver having its threshold switchpoint centered about the mid-point of the voltage excursion of the incoming driver signal. It has been suggested in the prior art that CMOS receivers be designed so that the receiver logic element has its normal switchpoint designed for matching the mid-point of the input drivers voltage excursion. However, the switchpoint for the on-chip CMOS receiver buffers varies with the process fabrication (channel length and threshold characteristics vary); power supply (variations of ±10% are common), and temperature changes (minus 55 degrees C. to 125 degrees C. as occurs in military specifications). As a result of these variations the switchpoint of the CMOS devices typically varies from 1 volt to 1.8 volts. The mid-point of an incoming TTL signal or CMOS signal can be tied to a reference voltage, but the switchpoint of the CMOS receiver buffer provides a moving target.

U.S. Pat. No. 4,471,242 teaches a TTL to CMOS input buffer. The principle of operation of this circuit is to provide a reference voltage generator between the $V_{DD}$ voltage used for the CMOS chip and the $V_{DD}$ voltage used for the input buffer driver. The reference voltage generator drops the $V_{DD}$ input buffer voltage to a voltage at or slightly above the high voltage level of the incoming TTL signal. The net effect of lowering the effective supply voltage is to eliminate the steady state current flowing through the input driver pair when the TTL input voltage is in the high state. This has nothing whatsoever to do with stabilizing the input voltage switchpoint.

The aforementioned problems become acute when the incoming driver signal is supplied to the CMOS buffer receiver over a transmission line. The resultant voltage levels at the input of the CMOS receiver which is at the end of a transmission line appear as a staircase wave form as opposed to a smooth, sharp, and fast voltage transition.

It has been suggested in the prior art that enlarging the driver to supply more current would result in a sufficient voltage swing to effect switching of the CMOS receiver on the first or second staircase wave form, however, the larger current driver also requires more device area and larger base delays accompanied by an increase in noise currents on the CMOS chips. The larger the number of receivers to be driven, the more severe the noise problem becomes when a larger driving current is necessary.

It would be extremely desirable to provide a CMOS input buffer receiver which has an ultra stable and predictable switchpoint.

SUMMARY OF THE INVENTION

It is a principal object of the present invention to provide a new and improved on-chip CMOS input buffer receiver.

It is another principal object of the present invention to provide a CMOS buffer receiver which reduces transmission line bus delays.

It is another principal object of the present invention to reduce the simultaneous switching noise from the input signal driving device.

It is another principal object of the present invention to provide a novel input buffer receiver having fewer transitors for a circuit which solves the bus delay and transmission problems.

It is a general object of the present invention to provide a CMOS buffer receiver having improved noise immunity.

It is another object of the present invention to provide a novel input buffer receiver having smaller transistors devices which results in higher density devices.

It is another general object of the present invention to provide an input buffer receiver having faster switching time than prior arts circuits.

According to these and other objects of the present invention, there is provided a pair of reference voltage generators which are coupled to a compensating network which detects the variations in wafer fabrication, supply voltage and temperature. The output of the compensating network is coupled to one input of a stabilized CMOS input converter whose output voltage and input switchpoint track or follow the pair of reference voltages of the reference voltage generators resulting in a stable input converter switchpoint.

DESCRIPTION OF THE PREFERRED EMBODIMENT

Figure 1:
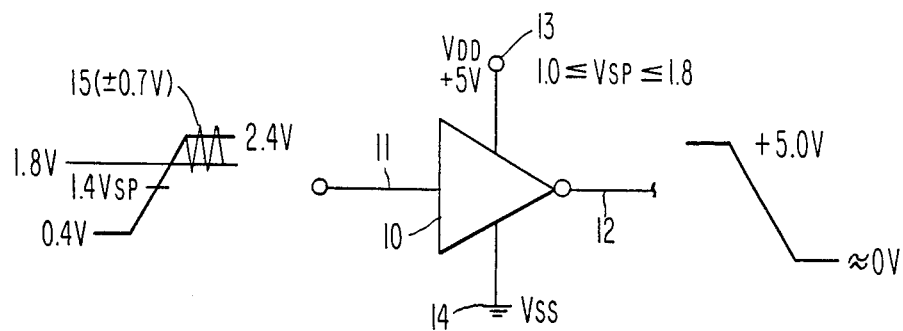
FIG. 1 is a schematic block diagram of a basic prior art TTL to CMOS input converter.

Refer now to a basic prior art type TTL to CMOS input converter 10. When the input TTL signal swings from 0.4 volts to 2.4 volts on input line 11, the output voltage on line 12 swings from plus 5 volts to approximately 0 volts. The switchpoint of the input converter 10 is adjusted during design so that it nominally switches at 1.4 volt which is the midpoint between the voltage extremes of the input signal on line 11. The typical CMOS converter is shown having a $V_{DD}$ voltage 13 of 5 volts and a Vss voltage 14 at ground or zero voltage.

As explained hereinbefore, due to process, supply voltage and temperature variations, the switchpoint of the CMOS converter 10 will vary from approximately 1.0 volts to 1.8 volts. When the switchpoint occurs at the higher value, the input signal must drive to a higher value, thus requiring more time than if the input signal only had to drive to 1.4 volts. If noise 15 occurs on the input signal on line 11 at ±0.7 volts and the switchpoint of the converter 10 is at 1.8 volts, then the output of the converter on line 12 will switch according to the transitions of the input noise voltage 15. However, if the input switch voltage was stabilized at 1.4 volts on the input 11, then the noise shown as voltage 15 is rejected by converter 10 resulting in improved noise immunity.

Figure 2:
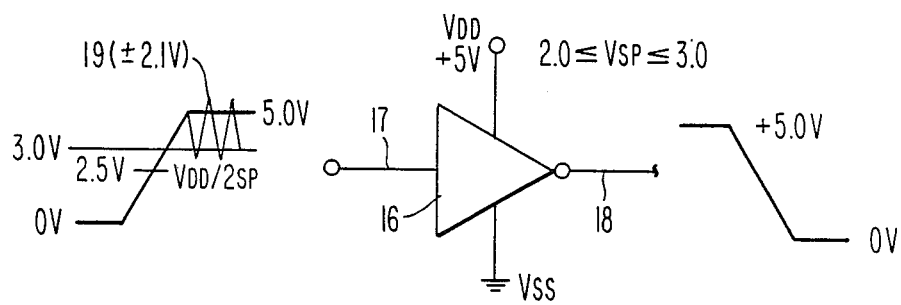
FIG. 2 is a schematic block diagram of a basic prior art CMOS to CMOS input converter.

Refer now to FIG. 2 showing a basic prior art CMOS to CMOS input receiver. The input CMOS signal shown as 0 volts to 5.0 volts occurs on input line 17 and is inverted as explained hereinbefore to provide an output signal of 5.0 volts to 0 volts on line 18. When the input signal on line 17 is coming from another chip, the switchpoint of the CMOS device can vary from 40 to 60% of the supply voltage $V_{DD}$ resulting in a switchpoint of from 2.0 volts to 3.0 volts as shown. If the input voltage has to reach the higher level of 3.0 volts in order to switch input receiver 16, then a longer delay occurs before switching as compared to the ideal switchpoint of 2.5 volts. A noise level of ±2.1 volts at 19 will result in switching the input buffer when it has a switchpoint of 3.0 volts.

Figure 3:
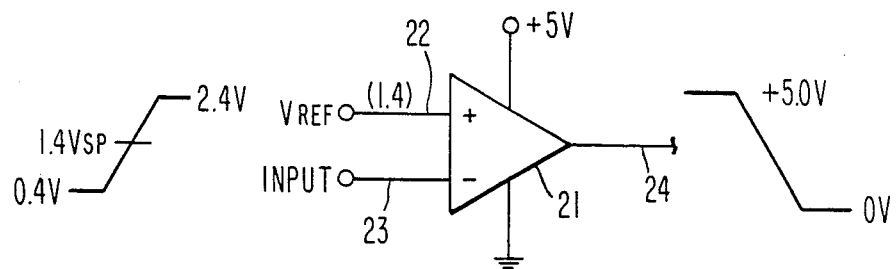
FIG. 3 is a schematic block diagram of an improved prior art TTL to CMOS input converter.

Refer now to FIG. 3 showing another prior art CMOS input converter 21 in the form of a comparator. A reference voltage of 1.4 volts is applied to the positive side of the comparator via line 22 and an input signal from a TTL device shown as 0.4 volts to 2.4 volts is applied to the negative side of the comparator via input line 23. The inverted CMOS output signal is shown as being 5.0 volts to 0 volts as occurred in the previous examples of input converters. The advantage of the input converter of FIG. 3 is that the switchpoint of the converter 21 is now stabilized over voltage, temperature, and process variation because of the extremely high gain of the high gain amplifier 21. The input converter 21 solves the aforementioned process, temperature and voltage supply problems which were explained with respect to FIGS. 1 and 2, however, the number of devices required to implement the FIG. 3 embodiment has now increased to at least nine devices. When a large number of devices are employed, larger propagation delays are encountered and the required area for implementing the circuit is now increased.

Figure 4:
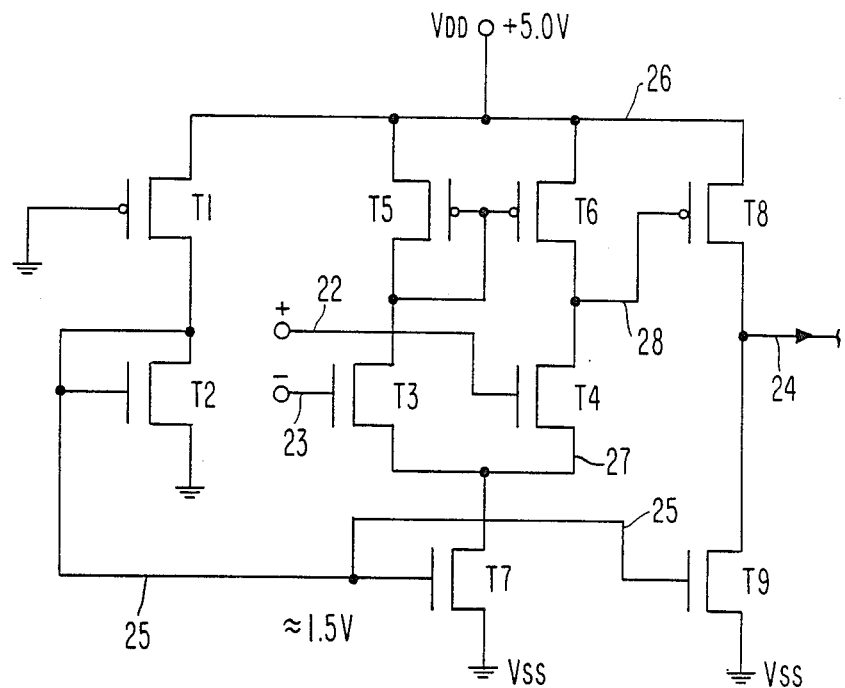
FIG. 4 is a schematic block diagram showing the transistor configuration for operation of the input converter of FIG. 3.

Refer now to FIG. 4 showing a typical implementation of the device shown in FIG. 3. The input reference voltage on line 22 and the input signal on line 23 are shown being applied to the input differential pair of transistors T3 and T4 connected to a common source point 27 which is driven by current source transistor T7 connected to Vss. Transistor T7 is driven by a bias voltage which is generated by p-n transistor pair T1 and T2 to provide approximately 1.5 volts on the gate line 25 of transistor T7. The 1.5 volt signal is also applied to the gate of transistor T9 to provide a constant current source load for active transistor T8 which is connected at its source via line 26 to a $V_{DD}$ voltage of 5.0 volts. Transistors T5 and T6 act as the active load transistor pair for the input differential pair T3 and T4. Output line 28 from the output of the differential stage is employed to feed the gate of active transistor T8 to provide an inverted output of 5.0 to 0 volts on line 24 as explained hereinbefore.

Figure 5:
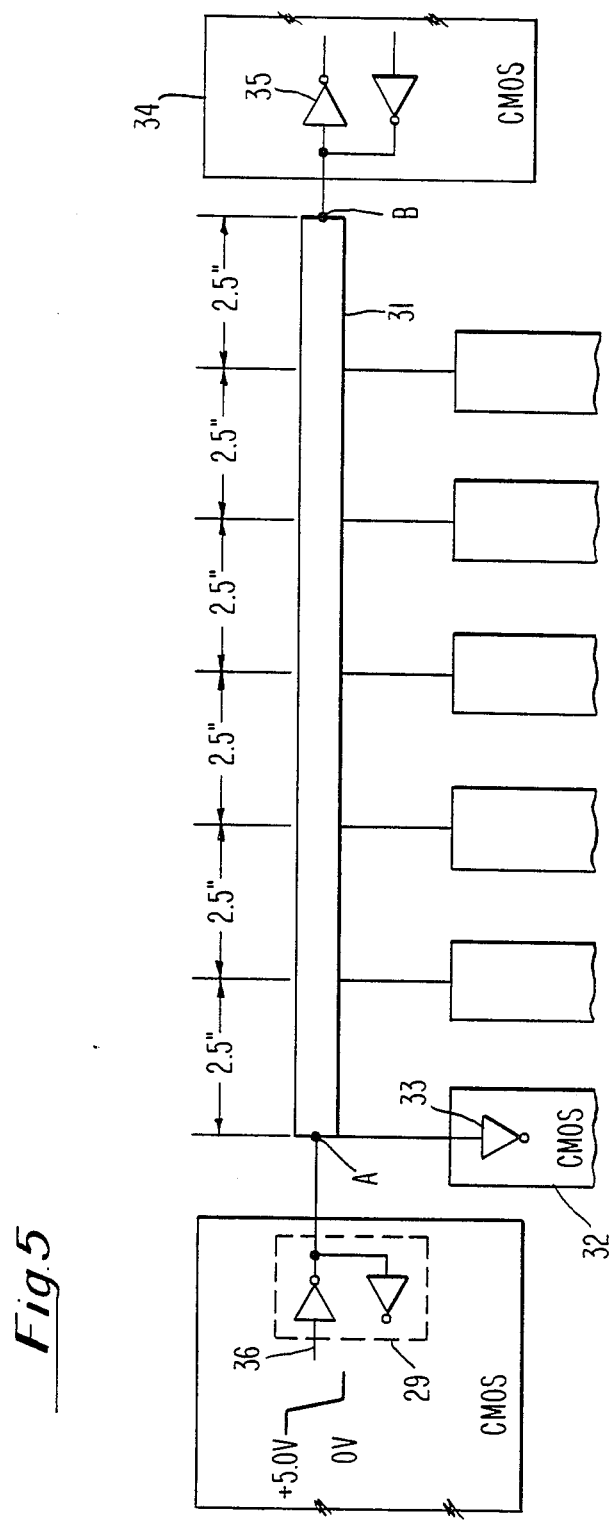
FIG. 5 is a schematic representation showing transmission line loading as occurs on printed circuit boards.

Refer now to FIG. 5 showing a CMOS bidirectional driver 29 connected to a transmission line 31 and also connected to a first CMOS chip 32 having an input buffer receiver 33 at the beginning of the transmission line and a second CMOS chip 34 having an input buffer receiver 35 at the end of the transmission line. Normally, the CMOS input buffer receiver is designed to accommodate either CMOS or TTL voltage swings about a 1.4 volt switchpoint. Assume that the transmission line is 15 inches long and has taps occurring at 2.5 inch intervals. The typical delay for the transmission line 31 is 5.1 nanoseconds from point A to point B and the loaded characteristic impedance $Z_O$ of the transmission line 31 is approximately 39 ohms. The ability of the bidirectional CMOS driver 29 to drive transmission lines like line 31 is limited by its current capabilities which are typically 15 milliamps. Because the transmission line 31 is typically not terminated in its characteristic impedance at point B, input voltage excursions at point A arriving at point B will be reflected in phase back toward point A. Because point A is not terminated in its characteristic impedance, the signal being reflected back from point B will arrive at point A in phase with the input signal and again be reflected back toward point B and will reoccur in a steady state fashion until the full signal voltage is reached at point A and point B.

Figure 6:
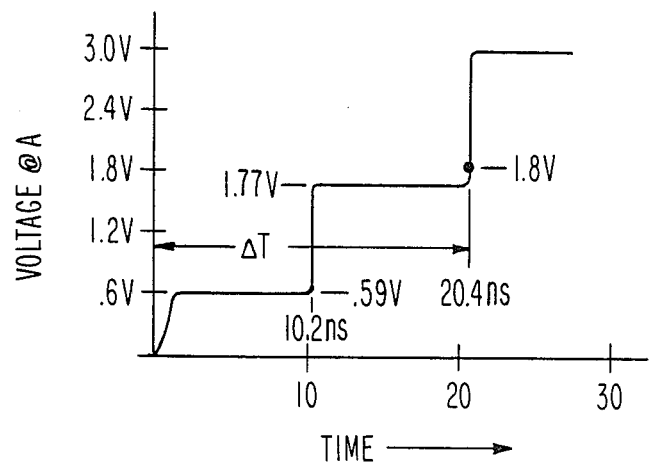
FIG. 6 is a schematic wave form diagram showing typical delays that occur on the transmission line shown in FIG. 5.

Refer now to FIG. 6 which shows the voltage at point A versus time as the abscissa. Assume that the input signal on line 36 to the CMOS bidirectional driver 29 swings from 5.0 volts to 0 volts or ground causing the output on the transmission line 31 at point A to initially start its swing from 0 volts in a positive direction. The initial voltage swing at point A will be to 0.59 volts as a result of 15 milliamps driving into transmission line having 39 ohms characteristics impedance. 5.1 nanoseconds later, the 0.59 volt signal arrives at point B and immediately doubles to 1.18 volts. A signal of 0.59 volts amplitude is reflected back from point B toward point A and arrives at point A 5.1 nanoseconds later as shown in FIG. 6 at 10.2 nanoseconds in time. The voltage on point A now increases to a value total of 1.77 volts. In a similar manner a 0.59 volt amplitude signal is again reflected from point A back to point B and arrives at point B 5.1 nanoseconds later and is reflected back to point A as shown as ΔT for a total of approximately 20.4 nanoseconds. It will be noted that it has taken 20.4 nanoseconds to reach a voltage level of 1.8 or greater volts at point A that can be detected as a logic high by the input buffer receiver 33. Had receiver 33 been designed to have a stabilized input switchpoint of 1.4 volts, the delay would only be 10.2 nanoseconds. It is well known in the integrated circuit art that CMOS drivers have limited current capabilities and are not suited to driving transmission lines. Any attempt to make the CMOS bidirectional driver 29 larger will result in requiring more real estate on the CMOS chip to implement the bidirectional driver. as well as causing a significant increase in the simultaneously switching generated noise. Thus, it will be understood that the two alternatives to reducing the bus transmission delay results in the only viable option of stabilizing the switchpoint of the CMOS input buffer receivers 33 and 34 rather than attempting to increase the size and current of the bidirectional driver 29.

Figure 7:
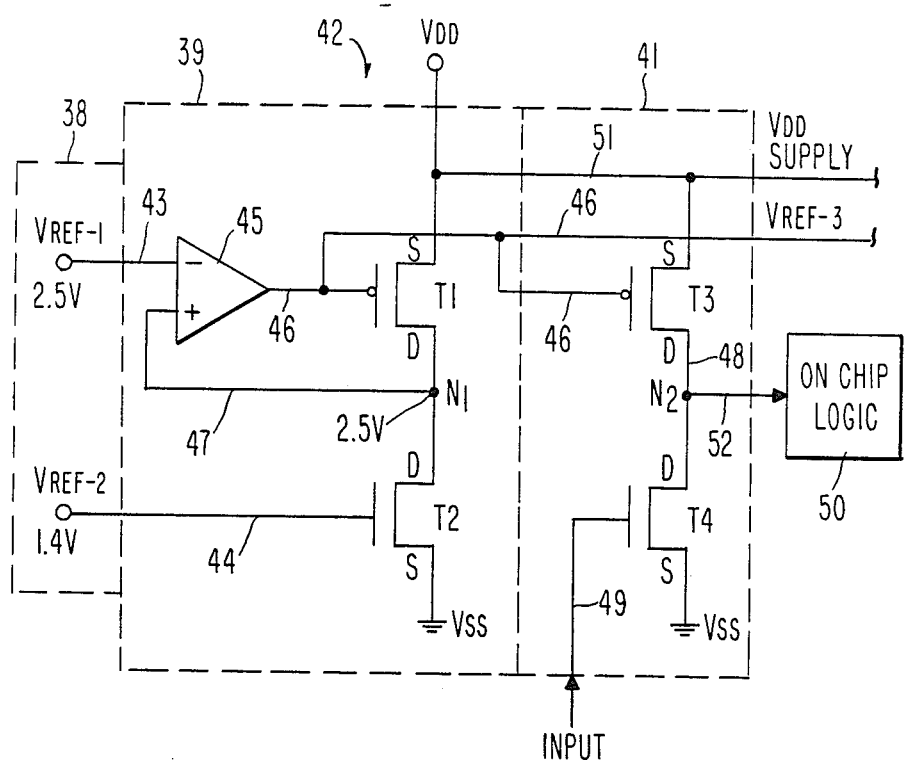
FIG. 7 is a schematic block diagram of the preferred embodiment input buffer receiver.

Refer now to FIG. 7 showing the preferred embodiment of the present invention. FIG. 7 is a schematic block diagram showing a reference voltage generator 38, a compensation network 39, and a stabilized input converter 41 which results in an ultra-stable input converter switchpoint. The input buffer receiver 42 has a first voltage reference $V_{REF-1}$ on line 43 and a second voltage reference $V_{REF-2}$ on line 44. The first reference voltage is applied to the negative side of OP-AMP 45 to produce an output on line 46 which is applied to the gate of transistor T1. The signal on the drain of transistor T1 shown on line 47 is fed back to the positive side of the OP-AMP 45 and also applied to the drain of transistor T2. The output of OP-AMP 45 is applied as a third reference voltage $V_{REF-3}$ to the gate of transistor T3 via line 46 which produces a signal at the drain of transistor T3 on output line 48. Line 48 is connected to the drain of transistor T4 which has its gate connected to the input line 49 of the input buffer receiver 42. The source of transistor T4 is connected to the Vss voltage supply similar to T2. Both transistors T1 and T3 have their sources connected to the $V_{DD}$ voltage supply on line 51.

The gate of transistor T2 is shown connected via line 44 to a second reference voltage $V_{REF-2}$. The output of the input buffer receiver 42 on line 52 is shown connected to a node N2.

As explained hereinbefore, the ideal situation desired is that when the input voltage on line 49 is at the middle of its transition, the output voltage on line 52 is at the middle of its transition. For example, for a TTL input the desired switchpoint or midpoint on line 49 and is 1.4 volts. Thus, when 1.4 volts is applied to the gate of transistor T4, the desired switchpoint voltage on output line 52 is typically 2.5 volts (i.e, one-half of $V_{DD}$). By setting the first input reference voltage $V_{REF-1}$ at 2.5 volts, the voltage on line 47 and at node N1 will always be the same voltage as the reference voltage or 2.5 volts. The second reference voltage $V_{REF-2}$ or line 44 is set at 1.4 volts. The device sizes for T1 and T2 are selected so that when the voltage on line 44 is 1.4 volts, the voltage on line 47 at node N2 is 2.5 volts, and the voltage on the gate of transistor T3 via line 46 is a function of wafer fabrication, temperature and supply voltage such that it provides a compensated variable voltage to the gate of transistor T3.

The width W of the gates of the transistors are designed such that the following ratio applies: WT3 over WT1 is equal to WT4 over WT2. Further, cross-multiplying it will be seen that WT2 over WT1 is also equal to WT4 over WT3 thereby, creating a tracking by transistor network T3, T4 (input buffer receiver 41) of the transistors T1, T2 forming the output of compensation network 39. It will be noted that the reference voltages on line 44 and generated at line 47 and node N1 are constant reference voltages such that when the input voltage on line 49 reaches the reference voltage 1.4 volts, the output voltage at node N2 is a reflection of the voltage at node N1 on line 47 or 2.5 volts. In effect, the switchpoint of the input buffer receiver 42 has been stabilized such that the switchpoint has been set on input line 44 to the mid-point of the input TTL voltage on line 49. Further, the output voltage on node N2 at output line 52 is always at the mid-point of its excursion or $V_{DD}/2$, when the input voltage is at its midpoint.

The stabilized input converter 41 always mirrors the stabilized voltage at the drain of transistor T2 (node N1) when the input voltage on line 49 is equal to the reference voltage on line 44 at transistor T2. The reference voltage on the gate of transistor T2 is a fixed value of 1.4 volts, thus, when the input on line 49 to the gate of transistor T4 reaches the 1.4 volt value, the output voltage on line 52 will become equal to the voltage at the drain of transistor T2 (node N1) which is held at 2.5 volts. For example, if current source load transistors T3 and T1 are made the same physical size and transistors T4 and T2 are made the same physical size, and the input voltage on line 49 is 1.4 volts, the bias voltages on the gate and drains of transistors T1 and T2 become identical to the bias voltages on the gate and drains of transistors T3 and T4 when the input voltage on line 49 equals 1.4 volts.

The compensation network 39 operates in the following manner. When the supply voltage $V_{DD}$ is equal to 5 volts and the device sizes of transistors T1 and T2 are such that the nominal voltage on the gate of transistor T1 at line 46 is approximately 2.0 volts, then the output of voltage at node N1 on line 47 becomes equal to the $V_{REF-1}$ voltage on line 43. As process variations etc. occur as explained hereinbefore, the voltage on line 46 changes. For example, when transistor T1 has much higher current drive than transistor T2, the voltage at node N1 will tend to rise causing an increased voltage input at the plus side of OP-AMP 45 which increases the output from the amplifier on line 46 thereby increasing the voltage at the gate of transistor T1 thereby adjusting or reducing the current drive of transistor T1 just enough to bring the voltage at node N1 and at line 47 back to 2.5 volts.

It will be noted that the voltage on line 46 becomes $V_{REF-3}$ as the gate input to transistor T3 is constantly modifying the input voltage to the gate of transistor T3. Thus, the current drive of transistor T3 is constantly being modified to compensate for variations in process, temperature and voltage supply so that when the input voltage on line 49 is 1.4 volts, the output voltage on line 52 is 2.5 volts.

The FIG. 3 input buffer receiver requires nine transistors and has two stages of propagation delay. The FIG. 7 embodiment employs only one reference voltage generator 38 and one compensation network 39 for each chip, however, a large number of input buffer receivers 41 comprising a transistor pair and having only one propagation delay is accommodated.

Figure 8:
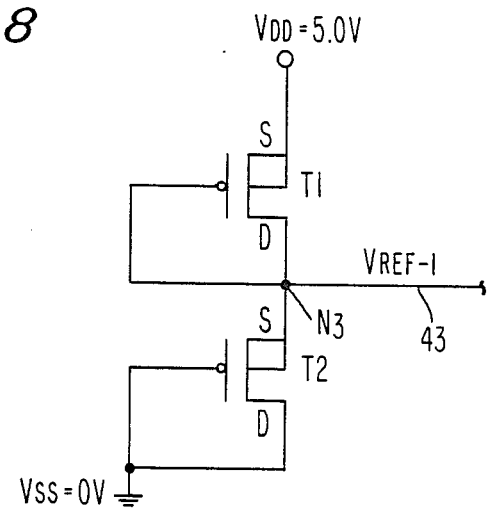
FIG. 8 is a schematic block diagram of one of the reference voltage generators employed in FIG. 7.

Refer now to FIG. 8 showing a CMOS voltage divider circuit for establishing the reference voltage $V_{REF-1}$. Transistors T1 and T2 are arranged as a p-channel voltage divider network. When transistors T1 and T2 have identical size and the supply voltage and ground are applied across the divider then the voltage at the node N3 is established at one-half of 5 volts or 2.5 volts as explained in FIG. 7.

Figure 9:
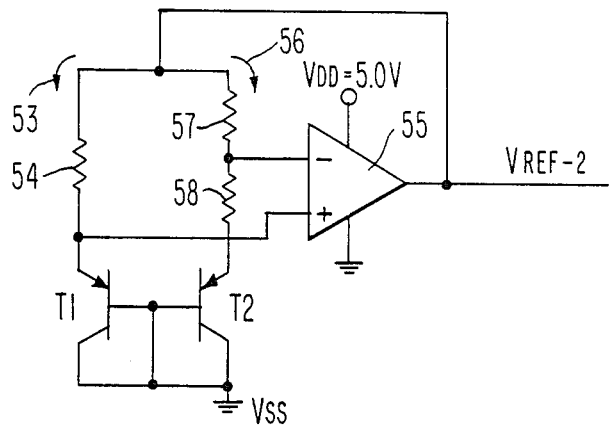
FIG. 9 is a schematic block diagram of a second reference voltage generator of the type employed in FIG. 7.

Refer now to FIG. 9 showing a CMOS band gap generator of the type commonly employed to generate stable reference voltages in the range of 1.2 to 1.5 volts. The current path shown at arrow 53 includes a resistor 54 and transistor T1 in series between ground and the voltage provided by the output of amplifier 55. The resistors 57, 58 and transistor T2 set up a current reference in current path 56 which is reflected into current path 53. Path 56 includes resistors 57 and 58 and transistor T2 also connected between ground and the voltage provided by the output of amplifier 55. Proper selection of the resistors 54, 57, and 58 and the area of the emitters of transistors T1 and T2 results in an output voltage on line 44 shown as $V_{REF-2}$ which is stabilized at a predetermined value, in this case 1.4 volts.

Figure 10:
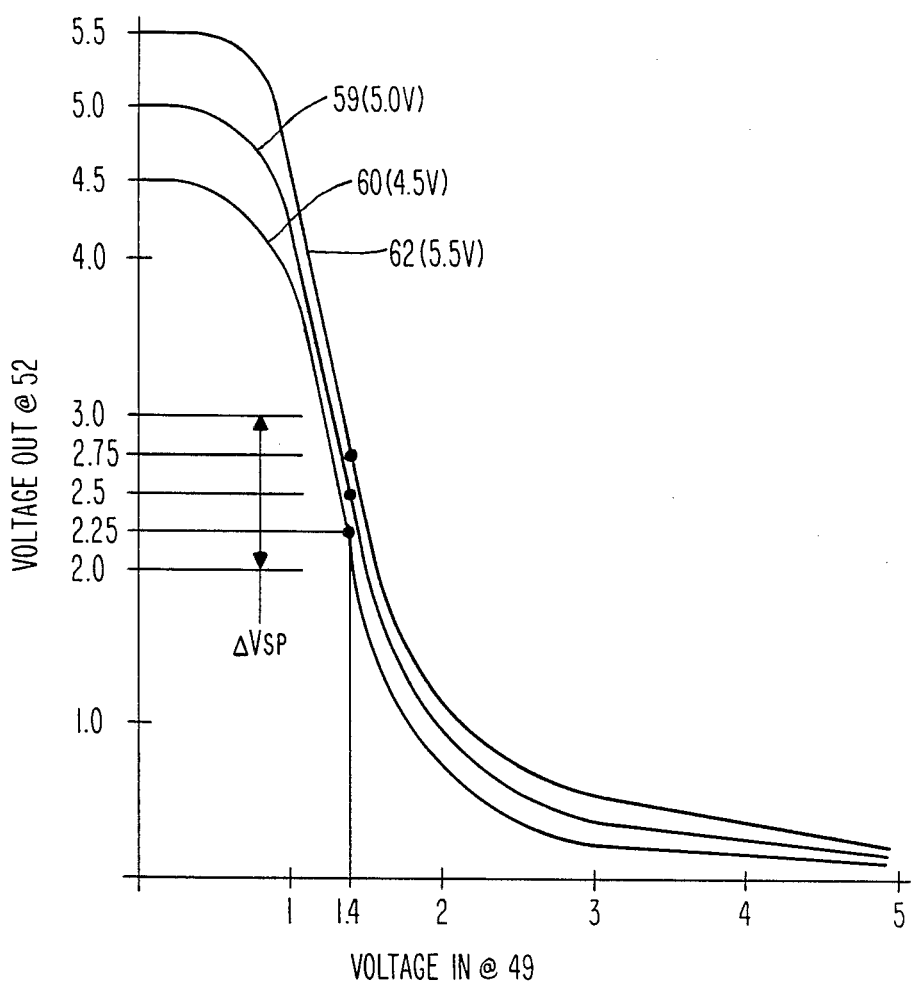
FIG. 10 is a transfer characteristic curve showing the relation of the output voltage of the CMOS input converter with respect to its input voltage.

Refer now to FIG. 10 showing a transfer characteristic curve having an output versus input voltage for the stablized input converter 41. Curve 59 represents an ideal condition when the supply voltage $V_{DD}$ is equal to 5.0 volts. When the voltage on input line 49 reaches at 1.4 volts, the output voltage at point 61 is seen to be 2.5 volts. Similarly when the $V_{DD}$ supply voltage is 5.5 volts as shown by curve 62, it can be seen that for an input voltage of 1.4 volts that the output on line 52 is at 2.75 volts as shown by point 63. Similarly when the $V_{DD}$ supply voltage drops to 4.5 volts and the voltage at the input on line 49 remains at 1.4 volts, the output on line 52 drops to 2.25 volts as shown at point 64. As the current drive of transistor T4 changes with the aforementioned process variations and temperature variations that the transfer characteristic curves remain stable. Further, the switchpoint of the CMOS devices in the on-chip logic block 50 of FIG. 7 are also varying with the aforementioned process and temperature variations and typically the switchpoint will vary from 2 to 3 volts as shown by the voltage $\Delta V_{SP}$ in FIG. 10. It will be observed that the curves 59, 60, and 62 are very close to being oriented vertically and are nearly parallel in the $\Delta V_{SP}$ region. Thus, when the switchpoint of the on-chip logic 50 occurs at the upper range of 3.0 volts, the stabilized input converter will effectively switch slightly below 1.4 volts (the ideal case). Conversely, when the switchpoint of the on-chip logic 50 is at the lower range of 2.0 volts, the effective switchpoint of the stabilized input converter 41 will be slightly higher than 1.4 volts. Even though there is a slight variation in the switchpoint, the FIG. 7 logic is completely acceptable but can be improved as will be explained hereinafter with regards to FIG. 11.

Figure 11:
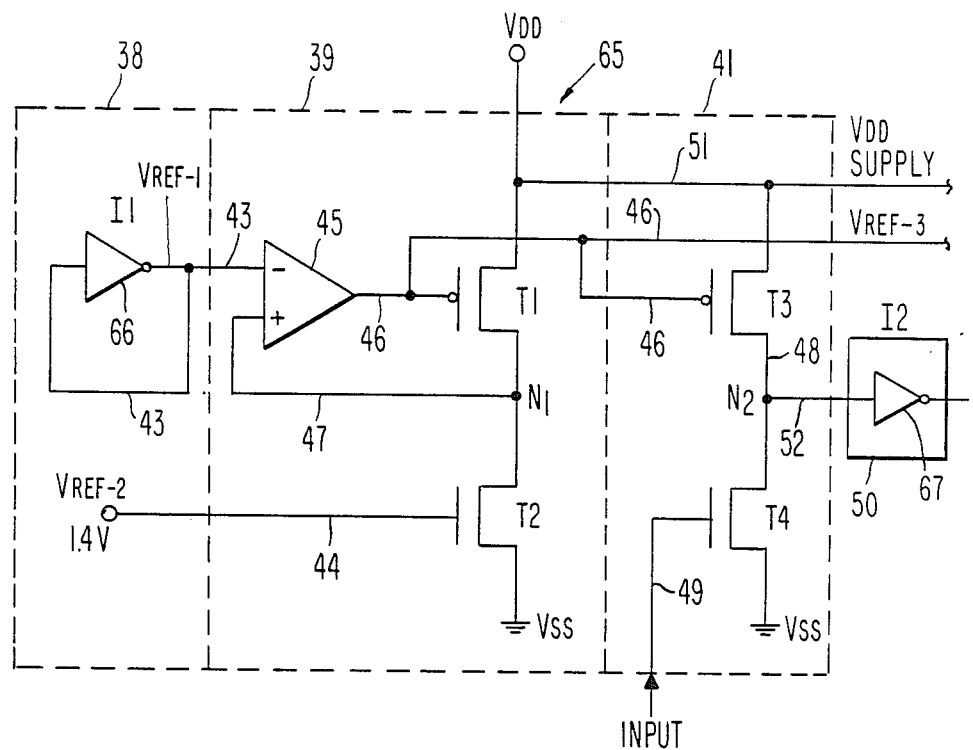
FIG. 11 is a schematic block diagram of a modified input buffer receiver.
Figure 12:
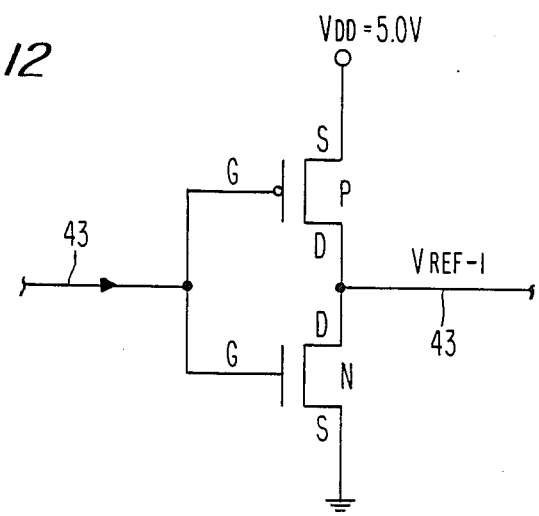
FIG. 12 is a schematic block diagram of an inverter of the type employed in FIG. 10.

Refer now to FIG. 11 showing an improved and modified input buffer receiver 65. The components and elements of FIG. 11 are basically identical to those explained hereinbefore with respect to FIG. 7 and are numbered the same, thus, do not require additional explanation. The generation of $V_{REF-1}$ is accomplished by inverter I1 shown at 66. Further, the on-chip logic element 50 is shown comprising inverter I2 shown at 67 which is a typical load. Inverters I1 and I2 are shown in greater detail in FIG. 12 as a p-n pair of CMOS transistors connected as an inverter. The inverter I1 has its output on line 43 connected to its own input line. The p-n pair is connected between a supply voltage $V_{DD}$ shown as 5.0 volts and ground. Such inverters are known and this inverter could be employed in FIG. 11 as a typical load 50 similar to inverter 67.

Inverter I1 (66) is employed as the $V_{REF-1}$ voltage on line 43 of FIG. 7 and FIG. 11. When the output of the inverter I1 is tied to its input, the output voltage level is at the switchpoint of inverter I1. The output of I1 is applied to the negative input reference of OP-AMP 45, thus, the voltage level on line 43 will be between 2 and 3 volts as discussed hereinbefore with regards to FIG. 10 due to variations of process, temperature and voltage supply. However, as the reference voltage $V_{REF-1}$ changes as an input to OP-AMP 45, the switchpoint of inverter I2 (which is the load) for the stabilized input converter 41 also changes in the same manner. Thus, the small voltage changes of the input voltage on line 49 that were previously described with regards to FIG. 10 no longer affect the switchpoint. Stated differently, when the input voltage is 1.4 volts on line 49, the output voltage at line 52 and node N2 is a value equal to the voltage of the switchpoint of the typical load inverter I2, thereby completely stabilizing or compensating for variations in process, temperature and variations in power supply $V_{DD}$.

Having explained a preferred embodiment of the present invention, it will be understood that the embodiment explained with reference to FIG. 7 and the modified completely stabilized embodiment shown in FIG. 11 can also be accomplished by modifying the arrangement of the p-n pair 41. An n-p pair or even an n-channel pair or a p-channel pair may be employed by appropriate adjustment of the compensation network 39. Further, the compensation network 39 need not be a p-n pair and can be accomplished by other transistor pairs.

It will be appreciated that the implementation of the FIG. 7 and FIG. 11 embodiments may be executed using n-channel pairs only or a p-channel pairs only embodiment which then permits the invention to be fabricated without the more complex CMOS wafer fabrication processes.

I claim:

1. A CMOS buffer receiver of the type having an ultra stable switching point, comprising:
    a voltage generator for generating a first and a second reference voltage,
    a compensation network coupled to said first and said second reference voltages,
    said compensation network comprising a series connected CMOS transistor pair coupled in series between a $V_{DD}$ supply voltage and a low reference voltage Vss,
    said compensation network further comprising a third reference voltage output which varies with process, temperature and voltage supply conditions, and
    a stabilized input converter comprising a series connected CMOS transistor pair coupled to said third reference voltage of said compensation network and having a signal output line connected between said transistor pair,
    said stabilized input converter having a voltage input line for receiving a predetermined voltage level signal and to produce a stabilized output voltage over a narrow voltage range well within the voltage switchpoint variations caused by process, temperature and supply voltage conditions.

2. A CMOS buffer receiver as set forth in claim 1 wherein said CMOS transistor pair of said compensation network comprise a p-n transistor pair connected in series at their drains.

3. A CMOS buffer receiver as set forth in claim 1 wherein said CMOS transistor pair of said stabilized input converter comprises a p-n transistor pair connected in series at their drains.

4. A CMOS buffer receiver as set forth in claim 1 wherein said compensation network comprises a high gain amplifier having one input connected to said first reference voltage and the output connected to its second input for producing said third reference voltage.

5. A CMOS buffer receiver as set forth in claim 4 wherein said output from said high gain amplifier is connected to the gate of the current source load transistor of said transistor pair of said conpensation network.

6. A CMOS buffer receiver as set forth in claim 4 wherein said output of said high gain amplifier is further connected to the gate of the current source load transistor of said CMOS transistor pair of said stabilized input converter.

7. A CMOS buffer receiver as set forth in claim 4 wherein the output of said high gain amplifier is coupled to a plurality of stabilized input converters to provide a variable gate voltage for a plurality of buffer receivers.

8. A CMOS buffer receiver as set forth in claim 7 wherein said plurality of buffer receivers are coupled to a voltage generator.

9. A CMOS buffer receiver as set forth in claim 1 wherein said CMOS transistor pair of said compensated network is provided with a third variable reference voltage input which changes with process, temperature and voltage supply conditions, and said third variable reference voltage is supplied to a plurality of stabilized input converters.

10. A CMOS buffer receiver as set forth in claim 7 wherein each of said buffer receivers comprise the same voltage generator, the same compensation network coupled to individual stabilized input converters.

11. A CMOS buffer receiver as set forth in claim 1 wherein said first reference voltage comprises a CMOS inverter amplifier.

12. A CMOS buffer receiver as set forth in claim 1 wherein said signal output line is coupled to an output CMOS inverter amplifier to provide a non-inverted output signal thereon.

13. A CMOS buffer receiver as set forth in claim 12 wherein said first reference voltage comprises an input CMOS inverter amplifier to provide a compensated input reference voltage.

14. A CMOS buffer receiver as set forth in claim 12 wherein said output and said input CMOS inverter amplifiers are designed to have the same switchpoints.

15. A CMOS buffer receiver as set forth in claim 1 wherein said voltage generator comprises a bias inverter for producing said first reference voltage, and the output of said stabilized input converter further comprises a third variable reference voltage supplied to a plurality of stabilized input converters, whereby the output of said stabilized input converters are forced to track the midpoint switching voltage of the CMOS compensation converter.

16. An MOS buffer receiver of the type having an ultra stable switching point, comprising:
 a first reference voltage,
 a second reference voltage,
 a compensation network coupled to said first and said second reference voltages,
 said compensation network providing as an output a third reference voltage which varies with temperature and MOS process,
 a stabilized input converter comprising a series connected MOS transistor pair coupled at its load transistor input to said third reference voltage and having a signal output line connected between the transitor pair, and
 said stabilized input converter further having a voltage input signal connected to the gate of the active transistor of said transistor pair, whereby the switchpoint of said voltage input signal is substantially fixed over the full range of process, temperature and voltage variations.

17. An MOS buffer receiver as set forth in claim 16 wherein said first reference voltage comprises a first MOS inverter I1.

18. An MOS buffer receiver as set forth in claim 17 which further includes:
 a second inverter (I2) connected to the signal output line of said transistor pair, whereby the switchpoint of said first inverter I1 varies with process and temperature conditions over a range of supply voltages in concert with the change of the switchpoint of said second inverter I2 so as to further stabilize the switchpoint of said input converter.

* * * * *